(12) United States Patent
Kim et al.

(10) Patent No.: US 12,074,153 B2
(45) Date of Patent: Aug. 27, 2024

(54) DISPLAY DEVICE

(71) Applicant: HiDeep Inc., Seongnam-si (KR)

(72) Inventors: Seyeob Kim, Seongnam-si (KR);
Bonkee Kim, Seongnam-si (KR);
Youngho Cho, Seongnam-si (KR)

(73) Assignee: HiDeep Inc. (KR)

( * ) Notice: Subject to any disclaimer, the term of this patent is extended or adjusted under 35 U.S.C. 154(b) by 406 days.

(21) Appl. No.: 17/437,949

(22) PCT Filed: Feb. 11, 2020

(86) PCT No.: PCT/KR2020/001922
§ 371 (c)(1),
(2) Date: Sep. 10, 2021

(87) PCT Pub. No.: WO2020/189894
PCT Pub. Date: Sep. 24, 2020

(65) Prior Publication Data
US 2022/0173091 A1    Jun. 2, 2022

(30) Foreign Application Priority Data

Mar. 19, 2019 (KR) .................. 10-2019-0030962

(51) Int. Cl.
*H01L 25/18* (2023.01)
*G06F 3/041* (2006.01)
(Continued)

(52) U.S. Cl.
CPC ............ *H01L 25/18* (2013.01); *G06F 3/0412* (2013.01); *G06F 3/04164* (2019.05);
(Continued)

(58) Field of Classification Search
CPC ............ H01L 25/18; H01L 24/32; H01L 2224/32225; G06F 3/0412; G06F 3/04164;
(Continued)

(56) References Cited

U.S. PATENT DOCUMENTS 9,600,112 B2   3/2017 Zhang
10,564,771 B2   2/2020 Choi
(Continued)

FOREIGN PATENT DOCUMENTS

CN   106445224 A   2/2017
CN   107703664 A   2/2018
(Continued)

OTHER PUBLICATIONS

Chinese Office Action 202080013365.1, Issued Nov. 24, 2023.

*Primary Examiner* — Elias Ullah
(74) *Attorney, Agent, or Firm* — The Belles Group, P.C.

(57) ABSTRACT

The present invention relates to a display device, and more particularly, to an Active Matrix Organic Light Emitting Diode (AMOLED) display device including a Touch and Display Driver Integration (TDDI). A display device according to an exemplary embodiment of the present invention includes: a TFT layer including a first region and a second region; an encapsulation layer disposed on the first region of the TFT layer; an organic light emitting layer disposed between the first region of the TFT layer and the encapsulation layer; a touch sensor disposed on the encapsulation layer; a touch sensor line extending from the touch sensor; a touch sensor trace formed on the TFT layer and electrically connected with the touch sensor line; a display line formed in the TFT layer and configured to transmit a display driving signal; a TDDI disposed in the second region of the TFT layer and connected with the touch sensor trace and the display line; and an FPCB bonded with a bonding region (Continued)

formed in the second region of the TFT layer and electrically connected with the TDDI.

9 Claims, 11 Drawing Sheets

(51) Int. Cl.
    *H10K 50/844*     (2023.01)
    *H10K 59/131*     (2023.01)
    *H01L 23/00*     (2006.01)
    *H10K 59/40*     (2023.01)

(52) U.S. Cl.
    CPC ......... *H10K 50/844* (2023.02); *H10K 59/131* (2023.02); *H01L 24/32* (2013.01); *H01L 2224/32225* (2013.01); *H10K 59/40* (2023.02)

(58) Field of Classification Search
    CPC ........ G06F 3/0446; G06F 2203/04103; H10K 50/844; H10K 59/131; H10K 59/40
    See application file for complete search history.

(56) References Cited

U.S. PATENT DOCUMENTS

| | | |
|---|---|---|
| 10,761,627 B2 | 9/2020 | Kim |
| 10,983,560 B2 | 4/2021 | Kwon |
| 11,201,195 B2 | 12/2021 | Hong et al. |
| 2019/0043928 A1 | 2/2019 | Hong et al. |
| 2021/0065627 A1* | 3/2021 | Chou .................. G09G 3/3291 |

FOREIGN PATENT DOCUMENTS

| | | |
|---|---|---|
| CN | 109388278 A | 2/2019 |
| JP | 2009080289 A | 4/2009 |
| KR | 10-2012-0130990 A | 12/2012 |
| KR | 20150061572 A | 6/2015 |
| KR | 10-2017-0018741 A | 2/2017 |
| KR | 10-2017-0054436 A | 5/2017 |
| KR | 10-2018-0032742 A | 4/2018 |
| KR | 10-2019-0005354 A | 1/2019 |
| KR | 10-2019-0014436 A | 2/2019 |

* cited by examiner

[Figure 11]
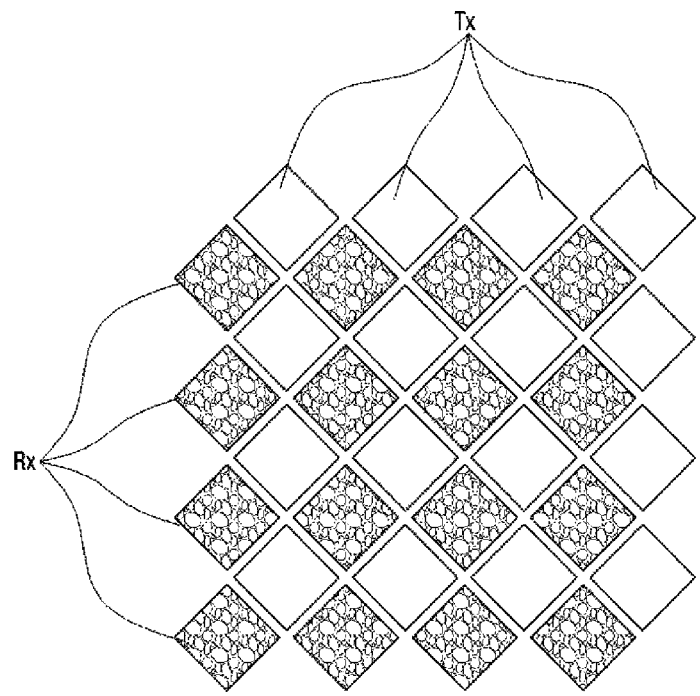

DISPLAY DEVICE

TECHNICAL FIELD

The present invention relates to a display device, and more particularly, to an Active Matrix Organic Light Emitting Diode (AMOLED) display device including a Touch and Display Driver Integration (TDDI).

BACKGROUND ART

In line with the information age, the display field has also developed rapidly, and in response to this, a Liquid Crystal Display (LCD) device, a Plasma Display Panel (PDP) display device, an Organic Light Emitting Diode Display (OLED) device, a Field Emission Display (FED) device, and the like are developed as a Flat Panel Display (FPD) device having the advantage of thinness, lightness, and low power consumption.

The FPD device is driven in response to a stimulus, that is, a touch, on an external surface of a display panel, to provide convenience to users. That is, the FPD device also provides a function of a touch panel including a touch sensor.

The touch panel is used as an output means for displaying an image, and is also widely used as an input means for receiving a command of a user through a touch of a specific region of the displayed image. That is, when a user touches the touch panel while viewing the image displayed on the display panel, the touch panel may detect location information of the corresponding touch region, compare the detected location information with location information of the image, and recognize a command of the user. There are various types of touch panels, such as a resistive type, a capacitive type, an infrared type, and an ultrasonic type, but the representative touch panel includes a capacitive sensing type touch panel and a pressure sensing type touch panel.

The touch panel has been manufactured by an add-on method in which a separate touch panel is added on the display panel, an on-cell method and an in-cell method in which the touch panel is directly formed on and integrated with the display panel, and the like.

FIGS. 1 and 2 are schematic lateral cross-sectional views of the LCD display devices in the related art.

In the LCD display devices in the related art illustrated in FIGS. 1 and 2, display driving ICs (hereinafter referred to as the "DDI") 10 for driving display panels 50 and 50', and touch ICs 30 for driving touch sensors 57, 57a, and 57b and detecting a touch signal are separately present at different locations, respectively.

In the LCD display devices in the related art illustrated in FIGS. 1 and 2, the DDI 10 is disposed on one surface of a TFT glass 51 of the display panel 50 and 50'. In the LCD display devices in the related art, first and second FPCBs 20 and 40 may be bent based on a fold line A. However, the DDI 10 is disposed on one surface of the TFT glass 51, so that a bezel is required to cover the DDI 10 from the front of the LCD display device.

Further, in the LCD display devices in the related art illustrated in FIGS. 1 and 2, bonding of the first and second FPCBs 20 and 40 is required at least three times.

In particular, in the LCD display device in the related art illustrated in FIG. 1, the DDI 10 is disposed on one surface of the TFT glass 51 of the LCD display panel 50, and the touch IC 30 is disposed on one surface of the second FPCB 40 connecting a touch sensor 57 and the first FPCB 20. Herein, the DDI 10 is electrically connected with the first FPCB 20 that connects the TFT glass 51 and a main board 90 to receive a display driving signal from the main board 90. On the main board 90, a processor, such as an AP, outputting a display driving signal is disposed.

In the LCD display device in the related art illustrated in FIG. 1, the touch sensor 57 may be disposed on the display panel 50 by an add-on method, and the touch sensor 57 is disposed on an upper surface of a touch PET layer 55. Herein, the touch PET layer 55 is disposed on a CF glass 53, and the CF glass 53 is disposed on the TFT glass 51. Although not illustrated in FIG. 1, a liquid crystal layer is disposed between the CF glass 53 and the TFT glass 51 of the display panel 50, and a backlight unit is disposed under the TFT glass 51.

In the LCD display device in the related art illustrated in FIG. 1, FPCB bonding is performed at least three times (one to three) for connecting the DDI 10 and the touch IC 30 to the main board 90. The first bonding is performed in a space 1 between one end of the first FPCB 20 and the TFT glass 51, the second bonding is performed in a space 2 between one end of the second FPCB 40 and the touch PET layer 55, and the third bonding is performed in a space 3 between the other end of the second FPCB 40 and the first FPCB 20.

The LCD display device in the related art illustrated in FIG. 2 is different from the LCD display device in the related art illustrated in FIG. 1 in the touch sensors 57a and 57b of the display panel 50'. The touch sensors 57a and 57b are implemented in the display panel 50' by a hybrid in-cell method. In particular, the display panel 50' of the display device in the related art illustrated in FIG. 2 includes the first touch sensor 57a and the second touch sensor 57b, and the first touch sensor 57a is disposed between the CF glass 53 and the TFT glass 51 and the second touch sensor 57b is disposed on an upper surface of the CF glass 53. Herein, the first touch sensor 57a is a driving sensor and the second touch sensor 57b is a detection sensor.

In the LCD display device in the related art illustrated in FIG. 2, FPCB bonding is performed at least three times (one to three) for connecting the DDI 10 and the touch IC 30 to the main board 90, similar to the LCD display device in the related art illustrated in FIG. 1.

FIGS. 3 to 5 are schematic lateral cross-sectional views of the rigid-type Active-Matrix Organic Light-Emitting Diode (AMOLED) display devices in the related art.

In the rigid-type AMOLED display devices in the related art illustrated in FIGS. 3 to 5, a DDI 10 for driving a display panel and a touch IC 30 for driving a touch sensor and detecting a touch signal are separately present at different locations, respectively.

In the rigid-type AMOLED display devices in the related art illustrated in FIGS. 3 and 4, the DDI 10 is disposed on one surface of a TFT Glass 71 of the display panel 70 and 70'. Herein, in the rigid-type AMOLED display devices in the related art illustrated in FIGS. 3 and 4, the DDI 10 is disposed on one surface of the TFT glass 71, so that a bezel is required to cover the DDI 10 from the front of the AMOLED display device.

In the meantime, in the rigid-type AMOLED display device in the related art illustrated in FIG. 5, the DDI 10 is disposed on one surface of a film substrate 74. The film substrate 74 connects the TFT glass 71 and a first FPCB 20. The film substrate 74 is a flexible material, and one part of the film substrate 74 may be folded based on a fold line A, so that the bezel may be decreased at a certain level compared to the rigid-type AMOLED display device in the related art illustrated in FIGS. 3 and 4, but due to the TFT glass 71, the bezel is inevitably present in a predetermined portion.

Further, in the rigid-type AMOLED display devices in the related art illustrated in FIGS. 3 to 5, bonding of the first and second FPCBs 20 and 40 is required at least three times for connecting the DDI 10 and the touch IC 30 to a main board 90.

In particular, in the rigid-type AMOLED display device in the related art illustrated in FIG. 3, the DDI 10 is disposed on one surface of the TFT glass 71 of the AMOLED display panel 70, and the touch IC 30 is disposed on one surface of the second FPCB 40 connecting the touch sensor 77 and the first FPCB 20. Herein, the DDI 10 is electrically connected with the first FPCB 20 that connects the TFT glass 71 and the main board 90 to receive a display driving signal from the main board 90.

In the rigid-type AMOLED display device in the related art illustrated in FIG. 3, the touch sensor 77 may be included in the display panel 70 by an add-on method, and the touch sensor 77 is disposed on an upper surface of a touch PET layer 75. Herein, the touch PET layer 75 is disposed on an encap glass 73, and the encap glass 73 is disposed on the TFT glass 71. Although not illustrated in FIG. 3, an organic light emitting layer is disposed between the encap glass 73 and the TFT glass 71 of the display panel 70.

In the rigid-type AMOLED display device in the related art illustrated in FIG. 3, FPCB bonding is performed at least three times (one to three) for connecting the DDI 10 and the touch IC 30 to the main board 90. The first bonding is performed in a space 1 between one end of the first FPCB 20 and the TFT glass 71, the second bonding is performed in a space 2 between one end of the second FPCB 40 and the touch PET layer 75, and the third bonding is performed in a space 3 between the other end of the second FPCB 40 and the first FPCB 20.

The rigid-type AMOLED display device in the related art illustrated in FIG. 4 is different from the rigid-type AMOLED display device in the related art illustrated in FIG. 3 in the touch sensor 77 of the display panel 70'. In particular, the display panel 70' of the rigid-type AMOLED display device in the related art illustrated in FIG. 4 includes the on-cell type touch sensor 77, and the touch sensor 77 is disposed on an upper surface of the encap glass 73.

In the rigid-type AMOLED display device in the related art illustrated in FIG. 4, FPCB bonding is performed at least three times (one to three) for connecting the DDI 10 and the touch IC 30 to the main board 90, similar to the rigid-type AMOLED display device in the related art illustrated in FIG. 3.

The rigid-type AMOLED display device in the related art illustrated in FIG. 5 is different from the rigid-type AMOLED display device in the related art illustrated in FIG. 4 in that a film substrate 74 is further included and the location of the DDI 10 is different.

In the rigid-type AMOLED display device in the related art illustrated in FIG. 5, FPCB bonding is performed more compared to the rigid-type AMOLED display device in the related art illustrated in FIG. 4, which is due to the film substrate 74, and the FPCB bonding is performed four times at least (one to four) for connecting the DDI 10 and the touch IC 30 to the main board 90.

FIG. 6 is a schematic lateral cross-sectional view of a flexible-type AMOLED display device in the related art.

In the flexible-type AMOLED display device in the related art illustrated in FIG. 6, a DDI 10 for driving a display panel and a touch IC 30 for driving a touch sensor and detecting a touch signal are separately present at different locations, respectively.

In the flexible-type AMOLED display device in the related art illustrated in FIG. 6, the DDI 10 is disposed on one surface of a film substrate 74. The film substrate 74 is a flexible material, and one part of the film substrate 74 may be folded based on a fold line A. The film substrate 74 connects the TFT glass 71' and the first FPCB 20.

An AMOLED display panel 70''' of the flexible-type AMOLED display device in the related art illustrated in FIG. 6 may include the TFT film 71', an encapsulation film 73' disposed on the TFT film 71', a touch PET layer 75 disposed on the encapsulation film 73', and an organic light emitting layer located between the TFT film 71' and the encapsulation film 73'. The touch sensor 77 is disposed on the display panel 70'' by an add-on method, and the touch sensor 75 is disposed on an upper surface of the touch PET layer 75 and the touch PET layer 75 is disposed on an upper surface of the encapsulation film 73'. The touch IC 30 is disposed on one surface of the second FPCB 40, and the second FPCB 40 connects the touch sensor 77 and the first FPCB 20.

In the flexible-type AMOLED display device in the related art illustrated in FIG. 6, bonding of the first and second FPCBs 20 and 40 is required at least four times (one to four) for connecting the DDI 10 and the touch IC 30 to the main board 90.

As described above, in the display devices in the related art illustrated in FIGS. 1 to 6, the DDI and the touch IC are separately present, and at least two FPCBs are required for connecting the DDI and the touch IC to the processor, and the bonding of the FPCB is inconveniently required at least three times.

DISCLOSURE

Technical Problem

A problem to be solved by the present invention is to provide a display device in which a touch sensor is electrically connected to a Touch Display Driver IC (TDDI) in which a DDI and a touch IC are integrated into one.

Another problem to be solved by the present invention is to provide a display device in which the number of FPCB is reduced.

Another problem to be solved by the present invention is to provide a display device in which the number of times of FPCB bonding is reduced.

Technical Solution

A display device according to an exemplary embodiment of the present invention includes: a TFT layer including a first region and a second region; an encapsulation layer disposed on the first region of the TFT layer; an organic light emitting layer disposed between the first region of the TFT layer and the encapsulation layer; a touch sensor disposed on the encapsulation layer; a touch sensor line extending from the touch sensor; a touch sensor trace formed on the TFT layer and electrically connected with the touch sensor line; a display line formed in the TFT layer and configured to transmit a display driving signal; a TDDI disposed in the second region of the TFT layer and connected with the touch sensor trace and the display line; and an FPCB bonded with a bonding region formed in the second region of the TFT layer and electrically connected with the TDDI.

A display device according to another exemplary embodiment of the present invention includes: a TFT layer; an encapsulation layer disposed on the TFT layer; an organic light emitting layer disposed between the TFT layer and the encapsulation layer; a touch sensor disposed on the encapsulation layer; a touch sensor line extending from the touch sensor to an edge region of the encapsulation layer; a display line formed in the TFT layer and configured to transmit a display driving signal; a TDDI disposed in an edge region of the TFT layer and connected with the display line; and an FPCB bonded to both a first bonding region formed in an edge region of the encapsulation layer and a second bonding region formed in an edge region of the TFT layer, and configured to electrically connect the touch sensor line and the TDDI.

Advantageous Effects

When the display device according to the exemplary embodiment of the present invention is used, there is an advantage in that it is possible to electrically and simply connect the touch sensor the Touch Display Driver IC (TDDI) in which the DDI and the touch IC are integrated into one.

Further, there is an advantage in reducing the number of FPCBs.

Further, there is an advantage in reducing the number of times of the FPCB bonding.

DESCRIPTION OF DRAWINGS

FIG. 11 is a diagram illustrating an example of a touch sensor.

MODE FOR INVENTION

Figure 1:
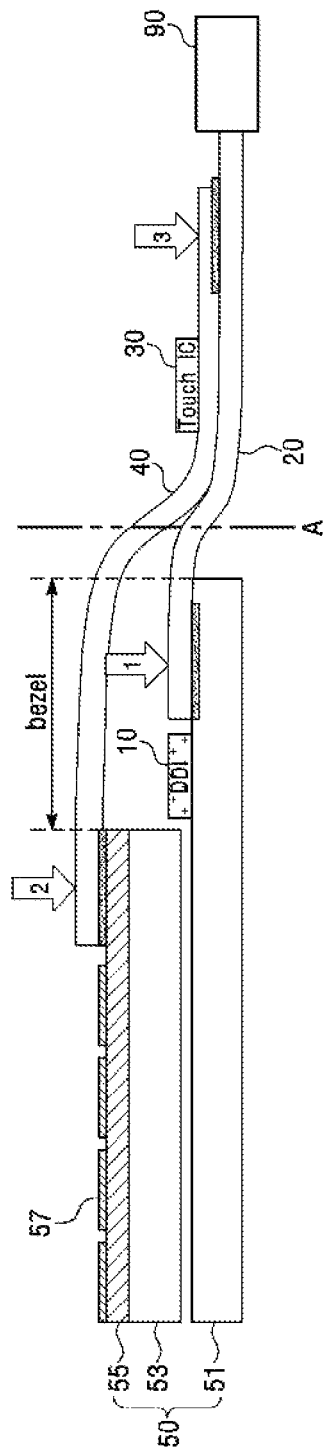
FIGS. 1 and 2 are schematic lateral cross-sectional views of the LCD display devices in the related art.
Figure 2:
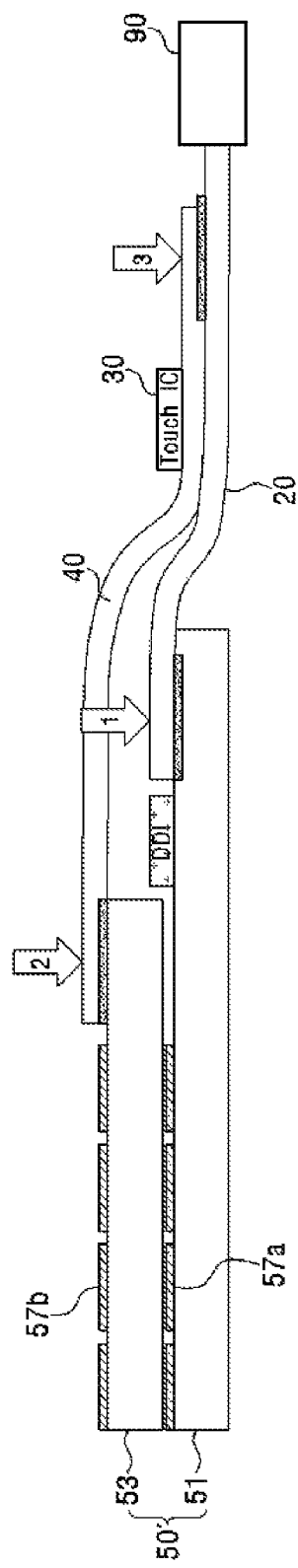
Figure 3:
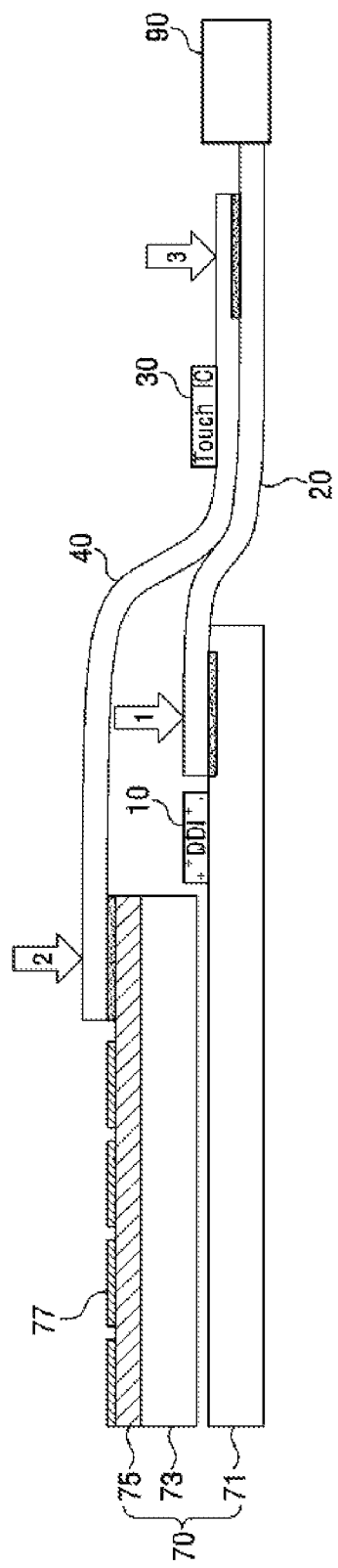
FIGS. 3 to 5 are schematic lateral cross-sectional views of the rigid-type Active-Matrix Organic Light-Emitting Diode (AMOLED) display devices in the related art.
Figure 4:
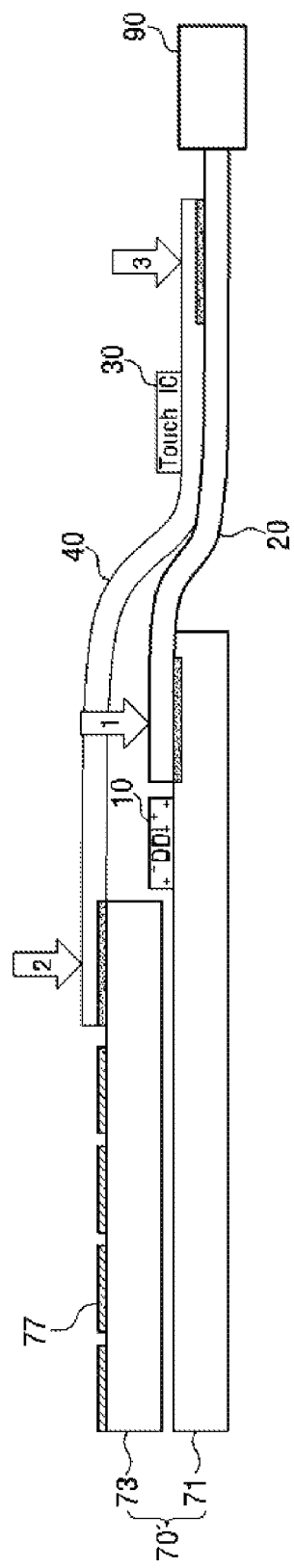
Figure 5:
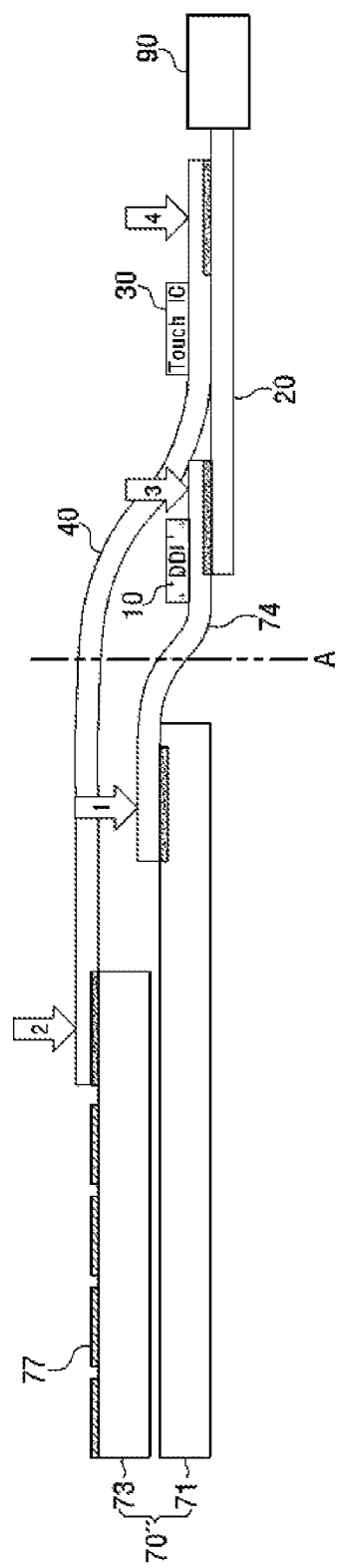
Figure 6:
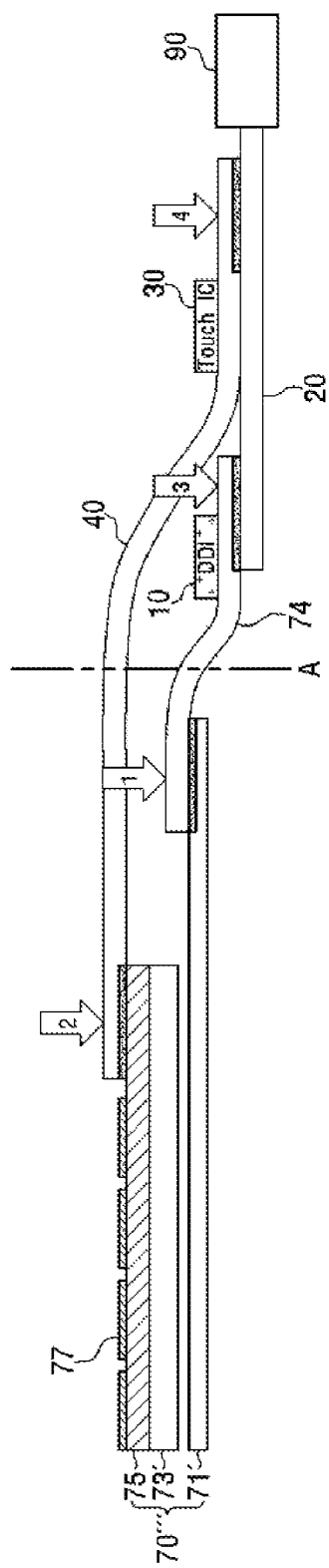
FIG. 6 is a schematic lateral cross-sectional view of a flexible-type AMOLED display device in the related art.

In the detailed description of the present invention described below, reference is made to the accompanying drawings, which illustrate a specific exemplary embodiment in which the present invention may be carried out, as an example. The exemplary embodiment is described in detail sufficient to enable a person skilled in the art to carry out the present invention. It should be understood that various exemplary embodiments of the present invention are different from each other, but need not to be mutually exclusive. For example, specific shapes, structures, and characteristics described herein may be implemented in other exemplary embodiments without departing from the spirit and the scope of the present invention in relation to one exemplary embodiment. Further, it should be understood that a location or disposition of an individual component in each disclosed exemplary embodiment may be changed without departing from the spirit and the scope of the present invention. Accordingly, the detailed description below is not intended to be taken in a limited meaning, and the scope of the present invention, if appropriately described, is limited only by the appended claims along with all scopes equivalent to those claimed by the claims. Like reference numerals in the drawings refer to the same or similar functions over several aspects.

The display device described in the present specification may be applied to a mobile phone, a smart phone, a notebook computer (laptop computer), a digital broadcasting terminal device, a Personal Digital Assistant (PDA), a navigation device, a slate PC, a tablet PC, an ultrabook, a wearable device, a KIOSK, and the like, provided with a touch screen.

Figure 7:
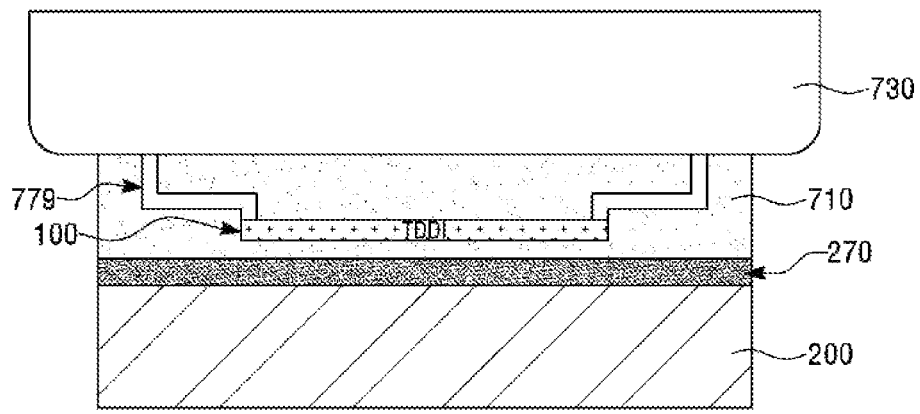
FIG. 7 is a front view of a display device according to an exemplary embodiment of the present invention, and illustrates one enlarged part.
Figure 8:
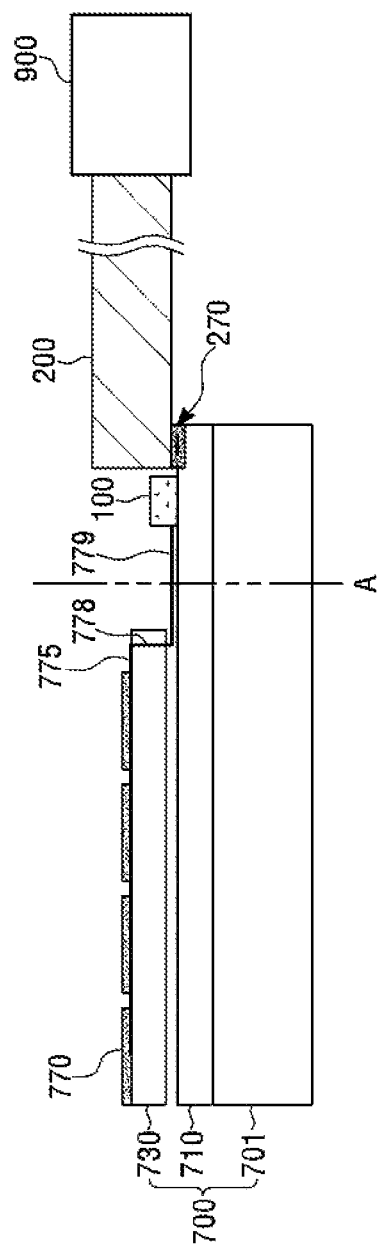
FIG. 8 is a cross-sectional view of the display device according to the exemplary embodiment of the present invention illustrated in FIG. 7.

FIG. 7 is a front view of a display device according to an exemplary embodiment of the present invention, and illustrates one enlarged part, and FIG. 8 is a cross-sectional view of the display device according to the exemplary embodiment of the present invention illustrated in FIG. 7.

Referring to FIGS. 7 and 8, a display device according to an exemplary embodiment of the present invention includes a TDDI 100, a display panel 700, and an FPCB 200.

In the TDDI 100, a DDI for driving the display panel 700 and a touch IC for applying a touch driving signal Tx to a touch sensor 770 and receiving a touch detection signal Rx from the touch sensor 770 are integrated into one.

The TDDI 100 may be electrically connected to a TFT array of a TFT layer 710 through a display line 150 to apply a display driving signal for driving the display panel 700.

The display line 150 may extend from the TFT layer 710 and be formed in the TFT layer 710. The display line 150 transmits the display driving signal provided from the TDDI 100 to the TFT array of the TFT layer 710.

The TDDI 100 may be electrically connected with the touch sensor 770 through a touch sensor trace 779, a via hole 778, and a touch sensor line 775 to apply a touch driving signal to the touch sensor 770 and receive a touch detection signal.

The touch sensor line 775 may extend from the touch sensor 770 and be formed in an encapsulation layer 730. Herein, the touch sensor line 775 may be connected with the conductive via hole 778 formed in the encapsulation layer 730, and the conductive via hole 778 may be connected with the touch sensor trace 779 formed in the TFT layer 710, and the touch sensor trace 779 may be connected with the TDDI 100. Herein, although not separately illustrated in the drawing, the touch sensor line 775 may be electrically connected with the touch sensor trace 779 without passing through the via hole 778.

The TDDI 100 may be disposed on the display panel 700. In particular, the TDDI 100 may be disposed on the TFT layer 710 of the display panel 700. The TDDI 100 may be disposed at one edge of the TFT layer 710. The TDDI 100 may be disposed on a region in the TFT layer 710, on which an organic light emitting layer (not illustrated) and the encapsulation layer 730 are not disposed.

The TDDI 100 is electrically connected with the FPCB 200. The edge portion of the TFT layer 710, in which the TDDI 100 is disposed, and the edge portion of the FPCB 200 are physically and electrically bonded to each other, so that the TDDI 100 may be electrically connected with the FPCB 200. As the TDDI 100 is electrically connected with the FPCB 200, data transception between the TDDI 100 and a main board 900 may be performed. A processor, such as an AP, is mounted to the main board 900.

The display panel 700 may be an Active Matrix Organic Light Emitting Diode (AMOLED) or a super AMOLED. The super AMOLED is the AMOLED in which the touch sensor is directly deposited on the encapsulation layer 730.

The display panel 700 may include a base film 701, the TFT layer 710 disposed on the base film 701, the encapsulation layer 730 disposed on the TFT layer 710, and an organic light emitting layer (not illustrated) disposed between the TFT layer 710 and the encapsulation layer 730.

The base film 701 may be made of polyethylene terephthalate (PET), and serves as a base supporting the TFT layer 710, the organic light emitting layer (not illustrated), and the encapsulation layer 730.

The TFT layer 710 may be made of polyimide (PI). The TFT layer 710 may also be called the TFT film. The TFT layer 710 may include the TFT array that controls light emission of the organic light emitting layer (not illustrated).

The TFT layer 710 is disposed on the base film 701. The TDDI 100 may be disposed on one surface of the TFT layer 710. The display line 150 transmitting a display driving control signal from the TDDI 100 to the TFT array may be formed on one surface of the TFT layer 710.

The touch sensor trace 779 may be formed on the TFT layer 710. One end of the touch sensor trace 779 may be electrically connected with the via hole 778 of the encapsulation layer 730, and the other end of the touch sensor trace 779 may be electrically connected with the TDDI 100 formed on the TFT layer 710. The touch sensor trace 779 may be formed in plural, and the touch driving signal may be provided from the TDDI 100 to the touch sensor 770 and the touch detection signal may be transmitted from the touch sensor 770 to the TDDI 100 through the touch sensor trace 779.

One side of the TFT layer 710 may extend longer than the encapsulation layer 730. In the extending portion, the TDDI 100 is disposed, and a bonding region 270 with the FPCB 200 may be formed.

The TFT layer 710 may include a first region and a second region. The encapsulation layer 730 may be disposed on the first region. The TDDI 100 may be disposed on the second region.

The TFT layer 710 may have the bonding region 270 bonded with the FPCB 200. The bonding with the FPCB 200 may be implemented through an Anisotropic Conductive Film (ACF). The bonding region 270 may be formed at one side edge portion of the TFT layer 710, and may be a portion adjacent to the TDDI 100. The main board 900 and the TDDI 100 may exchange a signal through the bonding region 270. Herein, in the TFT layer 710, a pad may be formed in a portion corresponding to the bonding region 270.

The TFT layer 710 is made of a thin and flexible material, so that the TFT layer 710 may be folded based on a fold line A together with the base film 701. The TFT layer 710 and the base film 701 are folded and bent together, so that the TDDI 100 may be positioned under the base film 701. A bezel may be minimized by making the fold line A be as close to the encapsulation layer 730 as possible.

The encapsulation layer 730 is disposed on the TFT layer 710. Herein, the encapsulation layer may also be called an encapsulation film. The organic light emitting layer (not illustrated) is disposed between the encapsulation layer 730 and the TFT layer 710, so that the encapsulation layer 730 is disposed on the organic light emitting layer (not illustrated).

The encapsulation layer 730 may be made of polyimide (PI).

The touch sensor 770 may be disposed on the encapsulation layer 730. The touch sensor 770 may be directly formed on one surface of the encapsulation layer 730. In the encapsulation layer 730, the touch sensor line 775 extending from the touch sensor 770 may be formed.

Herein, the touch sensor 770 may adopt the add-on method in which the touch sensor 770 is formed on one surface of a predetermined PET film (not illustrated), and the other surface of the PET film (not illustrated) is added to one surface of the encapsulation layer 730.

In the encapsulation layer 730, the via hole 778 plated with a conductive material may be formed. The via hole 778 may be formed in plural in an edge portion adjacent to the TDDI 100 in the encapsulation layer 730.

The touch sensor line 775 formed in the encapsulation layer 730 is connected with an upper portion of the via hole 778. A lower portion of the via hole 778 is connected with the touch sensor trace 779 formed in the TFT layer 710. Through the touch sensor line 775, the via hole 778, and the touch sensor trace 779, the touch driving signal may be provided from the TDDI 100 to the touch sensor 770, and the touch detection signal may be transmitted from the touch sensor 770 to the TDDI 100.

The touch sensor 770 may be formed in the encapsulation layer 730 of the display panel 700. The touch sensor 770 may be formed on one surface of the encapsulation layer 730 in a single layer (one layer). For example, in the touch sensor 770, the plurality of driving electrodes Tx and the plurality of receiving electrodes Rx may be formed in a single layer as illustrated in FIG. 11. However, the present invention is not limited thereto, and the touch sensor 770 may also be formed in the display panel 700 in dual layers (two layers). Herein, the touch sensor 770 may also be implemented in a mutual capacitance or self-capacitance method, but is not limited thereto, and may also be implemented in a resistive method.

In the display device according to the exemplary embodiment of the present invention illustrated in FIGS. 7 and 8, the TDDI 100 in which the DDI and the touch IC are integrated is disposed on the TFT layer 710 of the display panel 700, and the touch sensor 770 and the TDDI 100 may be electrically connected through the touch sensor line 775 formed in the encapsulation layer 730, the via hole 778 of the encapsulation layer 730, and the touch sensor trace 779 formed in the TFT layer 710. Further, the main board 900 and the TDDI 100 may be electrically connected with once bonding between the FPCB 200 and the TFT layer 710. Accordingly, only one FPCB 200 may be used for connecting the main board 900 and the TDDI 100, and the main board 900 and the TDDI 100 are connected through once bonding, thereby achieving an advantage in that the manufacturing process is simple. In addition, the FPCB 200 is minimally used, and the number of times of the bonding is minimum, so that there is an advantage in that it is possible to further decrease a thickness of the display device and minimize a bezel area of the display device.

Figure 9:
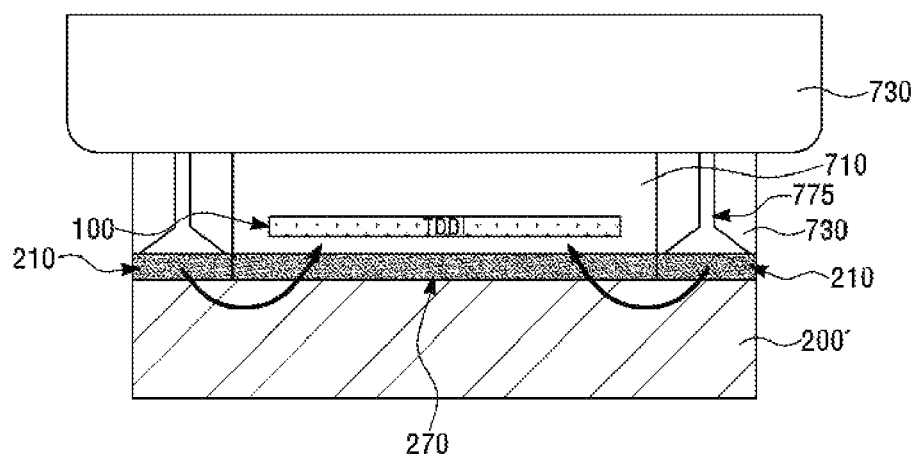
FIG. 9 is a front view of a display device according to another exemplary embodiment of the present invention, and illustrates one enlarged part.
Figure 10:
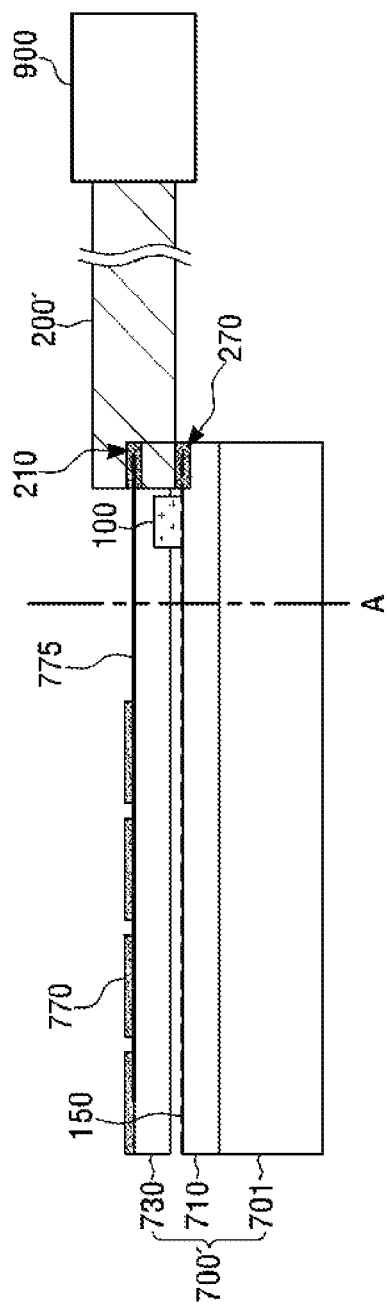
FIG. 10 is a cross-sectional view of the display device according to another exemplary embodiment of the present invention illustrated in FIG. 9.

FIG. 9 is a front view of a display device according to another exemplary embodiment of the present invention, and illustrates one enlarged part, and FIG. 10 is a cross-sectional view of the display device according to another exemplary embodiment of the present invention illustrated in FIG. 9.

Referring to FIGS. 9 and 10, a display device according to another exemplary embodiment of the present invention includes a TDDI 100, a display panel 700', and a FPCB 200'.

In the TDDI 100, a DDI for driving the display panel 700' and a touch IC for applying a touch driving signal Tx to a touch sensor 770 and receiving a touch detection signal Rx from the touch sensor 770 are integrated into one.

The TDDI 100 may be electrically connected to a TFT array of a TFT layer 710 through a display line 150 to apply a display driving signal for driving the display panel 700'.

The display line 150 may extend from the TFT layer 710 and be formed in the TFT layer 710. The display line 150 transmits the display driving signal provided from the TDDI 100 to the TFT array of the TFT layer 710.

The TDDI 100 may be electrically connected with the touch sensor 770 through the FPCB 200' and a touch sensor line 775, to apply a touch driving signal to the touch sensor 770 and receive a touch detection signal.

The touch sensor line 775 may extend from the touch sensor 770 and be formed in an encapsulation layer 730. Herein, the touch sensor line 775 may be connected with the FPCB 200' through a first bonding region 210. A connection line pattern (not illustrated) formed in the FPCB 200' may be electrically connected with the TDDI 100 through a second bonding region 270.

The TDDI 100 may be disposed on the display panel 700'. In particular, the TDDI 100 may be disposed on the TFT layer 710 of the display panel 700'. The TDDI 100 may be disposed at one edge of the TFT layer 710. The TDDI 100 may be disposed on a region in the TFT layer 710, on which an organic light emitting layer (not illustrated) and the encapsulation layer 730 are not disposed.

The TDDI 100 is electrically connected with the FPCB 200'. The edge portion of the TFT layer 710, in which the TDDI 100 is disposed, and the edge portion of the FPCB 200' are physically and electrically bonded to each other, so that the TDDI 100 may be electrically connected with the FPCB 200'. As the TDDI 100 is electrically connected with the FPCB 200', data transception between the TDDI 100 and a main board 900 may be performed. A processor, such as an AP, is mounted to the main board 900.

The display panel 700' may be an Active Matrix Organic Light Emitting Diode (AMOLED) or a super AMOLED. The super AMOLED is the AMOLED in which the touch sensor is directly deposited on the encapsulation layer 730.

The display panel 700' may include a base film 701, the TFT layer 710 disposed on the base film 701, the encapsulation layer 730 disposed on the TFT layer 710, and an organic light emitting layer (not illustrated) disposed between the TFT layer 710 and the encapsulation layer 730.

The base film 701 may be made of polyethylene terephthalate (PET), and serves as a base supporting the TFT layer 710, the organic light emitting layer (not illustrated), and the encapsulation layer 730.

The TFT layer 710 may be made of polyimide (PI). The TFT layer 710 may include the TFT array that controls light emission of the organic light emitting layer (not illustrated).

The TFT layer 710 is disposed on the base film 701. The TDDI 100 may be disposed on one surface of the TFT layer 710. The display line 150 transmitting a display driving control signal from the TDDI 100 to the TFT array may be formed on one surface of the TFT layer 710.

The connection line pattern may be formed in the TFT layer 710. One end of the connection line pattern may be electrically connected with the second bonding region 270, and the other end of the connection line pattern may be electrically connected with the TDDI 100 formed on the TFT layer 710. The connection line pattern may be formed in plural, and a touch driving signal may be provided from the TDDI 100 to the touch sensor 770 via the FPCB 200' through the connection line pattern, and the touch detection signal may be transmitted from the touch sensor 770 to the TDDI 100 via the FPCB 200'.

The TFT layer 710 may have the bonding region 270 bonded with the FPCB 200'. The bonding with the FPCB 200' may be implemented through an Anisotropic Conductive Film (ACF). The second bonding region 270 may be formed at one side edge portion of the TFT layer 710, and may be a portion adjacent to the TDDI 100. The main board 900 and the TDDI 100 may exchange a signal through the second bonding region 270. Herein, in the TFT layer 710, a pad may be formed in a portion corresponding to the second bonding region 270.

The TFT layer 710 is made of a thin and flexible material, so that the TFT layer 710 may be folded based on a fold line A together with the base film 701 and the encapsulation layer 730. The TFT layer 710, the base film 701, and the encapsulation layer 730 are folded and bent together, so that the TDDI 100 may be positioned under the base film 701. A bezel may be minimized by making the fold line A be as close to the touch sensor 770 as possible.

The encapsulation layer 730 is disposed on the TFT layer 710. The organic light emitting layer (not illustrated) is disposed between the encapsulation layer 730 and the TFT layer 710, so that the encapsulation layer 730 is disposed on the organic light emitting layer (not illustrated).

The encapsulation layer 730 may be made of polyimide (PI).

The touch sensor 770 may be disposed on the encapsulation layer 730. The touch sensor 770 may be directly formed on one surface of the encapsulation layer 730. In the encapsulation layer 730, the touch sensor line 775 extending from the touch sensor 770 may be formed.

Herein, the touch sensor 770 may also adopt the add-on method in which the touch sensor 770 is formed on one surface of a predetermined PET film (not illustrated), and the other surface of the PET film (not illustrated) is added to one surface of the encapsulation layer 730.

The first bonding region 210 for bonding with the FPCB 200' may be disposed at one side edge of the encapsulation layer 730. The touch sensor line 775 may extend to the first bonding region 210 to be electrically with the FPCB 200'.

Through the connection line pattern of the touch sensor line 775, the first bonding region 210, the FPCB 200', the second bonding region 270, and the TFT layer 710, the touch driving signal may be provided from the TDDI 100 to the touch sensor 770, and the touch detection signal may be transmitted from the touch sensor 770 to the TDDI 100.

The touch sensor 770 may be formed in the encapsulation layer 730 of the display panel 700. The touch sensor 770 may be formed on one surface of the encapsulation layer 730 in a single layer (one layer). However, the present invention is not limited thereto, and the touch sensor 770 may also be formed in the display panel 700 in dual layers (two layers). Herein, the touch sensor 770 may also be implemented in a mutual capacitance or self-capacitance method, but is not limited thereto, and may also be implemented in a resistive method.

In the display device according to another exemplary embodiment of the present invention illustrated in FIGS. 9 and 10, the TDDI 100 in which the DDI and the touch IC are integrated is disposed on the TFT layer 710 of the display panel 700', and the touch sensor 770 and the TDDI 100 may be electrically connected through the touch sensor line 775 formed in the encapsulation layer 730, the first bonding region 210, the connection line pattern formed in the FPCB 200', the second bonding region 270, and the connection line pattern of the TFT layer 710. Further, the main board 900 and the TDDI 100 may be electrically connected with one-time bonding between the FPCB 200' and the TFT layer 710, and between the FPCB 200' and the encapsulation layer 730. Herein, the encapsulation layer 730 has a thickness of about 8 μm which is very thin, so that it is possible to bond the FPCB 200' and the TFT layer 710, and the FPCB 200' and the encapsulation layer 730 by using the bonding method using the ACF at one time. Accordingly, only one FPCB 200' may be used for connecting the main board 900 and the TDDI 100, and the main board 900 and the TDDI 100 are connected through once bonding, thereby achieving an advantage in that the manufacturing process is simple. In addition, the FPCB 200' is minimally used, and the number of times of the bonding is minimum, so that there is an advantage in that it is possible to further decrease a thickness of the display device and minimize a bezel area of the display device.

The aforementioned characteristic, structure, effect, and the like described in the exemplary embodiments are included in one exemplary embodiment of the present invention, and are not essentially limited to only one exemplary embodiment. Further, the characteristic, structure, effect, and the like described in each exemplary embodiment may be carried out in other exemplary embodiments through combination or modification by those skilled in the art to which the exemplary embodiments pertain. Accordingly, it shall be construed that contents relating to the combination and the modification are included in the scope of the present invention.

In addition, although the exemplary embodiments have been described above, these are only examples, and do not limit the present invention, and those skilled in the art will know that various modifications and applications which are not exemplified above are possible within the scope without departing from the essential characteristics of the present exemplary embodiment. For example, each component specifically presented in the exemplary embodiment may be modified and implemented. Further, it should be interpreted that the differences in relation to the modification and the application are included in the scope of the present invention defined in the accompanying claims.

EXPLANATION OF REFERENCE NUMERALS AND SYMBOLS

100: TDDI
200, 200': FPCB
700, 700': Display panel
770: Touch sensor

The invention claimed is:
1. A display device, comprising:
a TFT layer including a first region and a second region;
an encapsulation layer disposed on the first region of the TFT layer;
an organic light emitting layer disposed between the first region of the TFT layer and the encapsulation layer;
a touch sensor disposed on the encapsulation layer;
a touch sensor line extending from the touch sensor;
a touch sensor trace formed on the TFT layer and electrically connected with the touch sensor line;
a display line formed in the TFT layer and configured to transmit a display driving signal;
a TDDI disposed in the second region of the TFT layer and connected with the touch sensor trace and the display line;
a FPCB bonded with a bonding region formed in the second region of the TFT layer and electrically connected with the TDDI,
wherein the TFT layer is bent based on a virtual line located between the encapsulation layer and the TDDI, and the TDDI and the FPCB are positioned under the TFT layer.
2. The display device of claim 1, wherein the touch sensor is directly formed on an upper surface of the encapsulation layer.
3. The display device of claim 1, wherein the encapsulation layer includes a via hole, and the touch sensor line and the touch sensor trace are connected to the via hole.
4. The display device of claim 1, further comprising:
a base film disposed under the first region and the second region of the TFT layer,
wherein the base film is bent based on the virtual line together with the TFT layer.
5. The display device of claim 1, wherein the bonding area and the FPCB are bonded through an Anisotropic Conductive Film (ACF).
6. A display device, comprising:
a TFT layer;
an encapsulation layer disposed on the TFT layer;
an organic light emitting layer disposed between the TFT layer and the encapsulation layer;
a touch sensor disposed on the encapsulation layer;
a touch sensor line extending from the touch sensor to an edge region of the encapsulation layer;
a display line formed in the TFT layer and configured to transmit a display driving signal;
a TDDI disposed in an edge region of the TFT layer and connected with the display line; and
a FPCB bonded to both a first bonding region formed in an edge region of the encapsulation layer and a second bonding region formed in an edge region of the TFT layer, and configured to electrically connect the touch sensor line and the TDDI,
wherein the TFT layer is bent based on a virtual line located between the touch sensor and the TDDI, and the TDDI and the FPCB are positioned under the TFT layer.
7. The display device of claim 6, wherein the touch sensor is directly formed on an upper surface of the encapsulation layer.
8. The display device of claim 6, further comprising:
a base film disposed under the TFT layer;
wherein the base film is bent based on the virtual line together with the TFT layer.
9. The display device of claim 6, wherein the first and second bonding areas and the FPCB are bonded through an Anisotropic Conductive Film (ACF).

* * * * *